(12) United States Patent
Regev

(10) Patent No.: US 7,084,669 B2
(45) Date of Patent: Aug. 1, 2006

(54) REDUCING SWING LINE DRIVER

(75) Inventor: Zvi Regev, West Hills, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 10/949,376

(22) Filed: Sep. 27, 2004

(65) Prior Publication Data

US 2005/0040868 A1    Feb. 24, 2005

Related U.S. Application Data

(62) Division of application No. 10/325,985, filed on Dec. 23, 2002, now Pat. No. 6,836,150.

(51) Int. Cl.
*H03K 19/0175* (2006.01)

(52) U.S. Cl. .......................... 326/83; 326/86

(58) Field of Classification Search ............. 326/82–90
See application file for complete search history.

(56) References Cited

U.S. PATENT DOCUMENTS

| | | | |
|---|---|---|---|
| 5,848,101 A | 12/1998 | Taylor | |
| 6,323,729 B1 | 11/2001 | Sevenhans et al. | |
| 6,414,899 B1 | 7/2002 | Afghahi et al. | |
| 6,501,306 B1 | 12/2002 | Kim et al. | |

*Primary Examiner*—Don Le
(74) *Attorney, Agent, or Firm*—Dickstein Shapiro Morin & Oshinsky LLP

(57) ABSTRACT

An apparatus and method is disclosed for a limited swing line driver. A driver circuit generates a voltage that is transmitted to a unity gain voltage amplifier and a common source amplifier. A source-follower circuit in the voltage amplifier is activated when the voltage reaches a voltage threshold for an activating transistor, sending voltage to the output of the common-source amplifier, resulting in an output with a reduced swing. In an alternate embodiment, a variable-level reduced swing line driver is disclosed that uses a transistor as a variable resister to alter the threshold voltages and level control. A level control circuit is further disclosed that controls one or more variable-level line drivers.

45 Claims, 7 Drawing Sheets

REDUCING SWING LINE DRIVER

This application is a divisional application of application Ser. No. 10/325,985 filed Dec. 23,2002 (now is a U.S. Pat. No. 6,836,150), which is hereby incorporated by reference.

FIELD OF THE INVENTION

The present invention is directed to electronic drivers and driver circuits, and specifically to driver circuits with a reduced swing output.

BACKGROUND OF THE INVENTION

For digital signal transmission, the lines of a typical PC board bus are long, thin conductors which extend relatively substantial lengths across the face of an insulating substrate, the substrate spacing each conductor from a ground plane and from other signal wires. As a result of this configuration, each line presents a significant capacitance which must be charged or discharged by a bus driver or similar circuit during data transmission. The result is substantial power consumption, particularly when a CMOS or TTL bus is driven between positive and negative power supply rails.

The power consumption resulting from parasitic bus line capacitance is affected negatively by data transmission rate across the bus line, as well as by line capacitance, the voltage swing on the driven line, and the driver supply voltage. The power loss may be expressed as $P=f*(C)*(V_s*V_l)$, or $f*C*V^2$, where P is the power loss through each conductor dissipated by the line driver, V is the voltage applied (where $V_s$ is the driver supply voltage and $V_l$ is the voltage swing), C is the capacitance of the driven line, conductor, and f is the frequency at which the line conductor is charged/discharged. If a driver output voltage swing exists from rail to rail, then $V_s=V_l=V$, and $P=f*C*V^2$. It should also be noted that some additional small power consumption results from the resistance of each bus line. The reduction of voltage swing on a driven line is especially useful inside integrated circuits, and also applies to bipolar integrated circuits (bipolar transistors also require a small voltage to turn such the transistor ON).

One technique for reducing power consumption involves reducing the capacitance of the bus lines themselves. This option, however, requires that the fabrication process for chips and for circuit boards be modified. A change in process to reduce line capacitance is expensive and may adversely effect the fabrication of other circuitry on chips and boards. Another option is to reduce the frequency at which data is transferred across the bus. Assuming that the width of the bus is not increased, this option simply trades off system performance for power reduction, an option which usually is not viable in the design and implementation of high performance circuits.

If a line is driven by voltages, swinging between the potential of ground and the potential of the power supply, the most efficient method for the reduction of power dissipation has been to lower the supply voltage, since during a rail to rail swing the power dissipation is directly related to the square of the supply voltage. Another option has been to reduce the voltage swing of the signal driving a line, provided that a line receiver, at the remote end of the line can tolerate a reduced voltage swing at its input.

Power reduction also can be achieved by reducing the voltage swings experienced throughout the structure. By limiting voltage swings, it is possible to reduce the amount of power dissipated as the voltage at a node or on a line decays during a particular event or operation, as well as to reduce the amount of power required to return the various decayed voltages to the desired state after the particular event or operation, or prior to the next access.

As mentioned previously, there typically is a trade-off between power and speed, with faster signal rates and circuit response times usually dictating greater power requirements. Faster sense amplifiers can also tend to be physically larger, relative to low speed, low power devices. Furthermore, the analog nature of sense amplifiers can result in their consuming an appreciable fraction of the total power. Although one way to improve the responsiveness of a sense amplifier is to use a more sensitive sense amplifier, any gained benefits are offset by the concomitant circuit complexity which nevertheless suffers from increased noise sensitivity. It is desirable, then, to limit bitline voltage swings and to reduce the power consumed by the sense amplifier.

BRIEF SUMMARY OF THE INVENTION

The present invention is directed at lowering power consumption by providing a tightly controlled line driver with a limited swing output. The line driver under the present invention uses an amplifier configuration wherein the threshold voltage of a transistor in the amplifier circuit is used as a swing limiter to limit the output voltage to a level not exceeding the supply voltage minus the threshold voltage. Under alternate embodiments, a level control circuit allows user to specify the acceptable voltage swing, wherein the output of the level control circuit is transmitted to one or more variable reduced-swing line driver circuits.

DETAILED DESCRIPTION OF THE INVENTION

Figure 1:
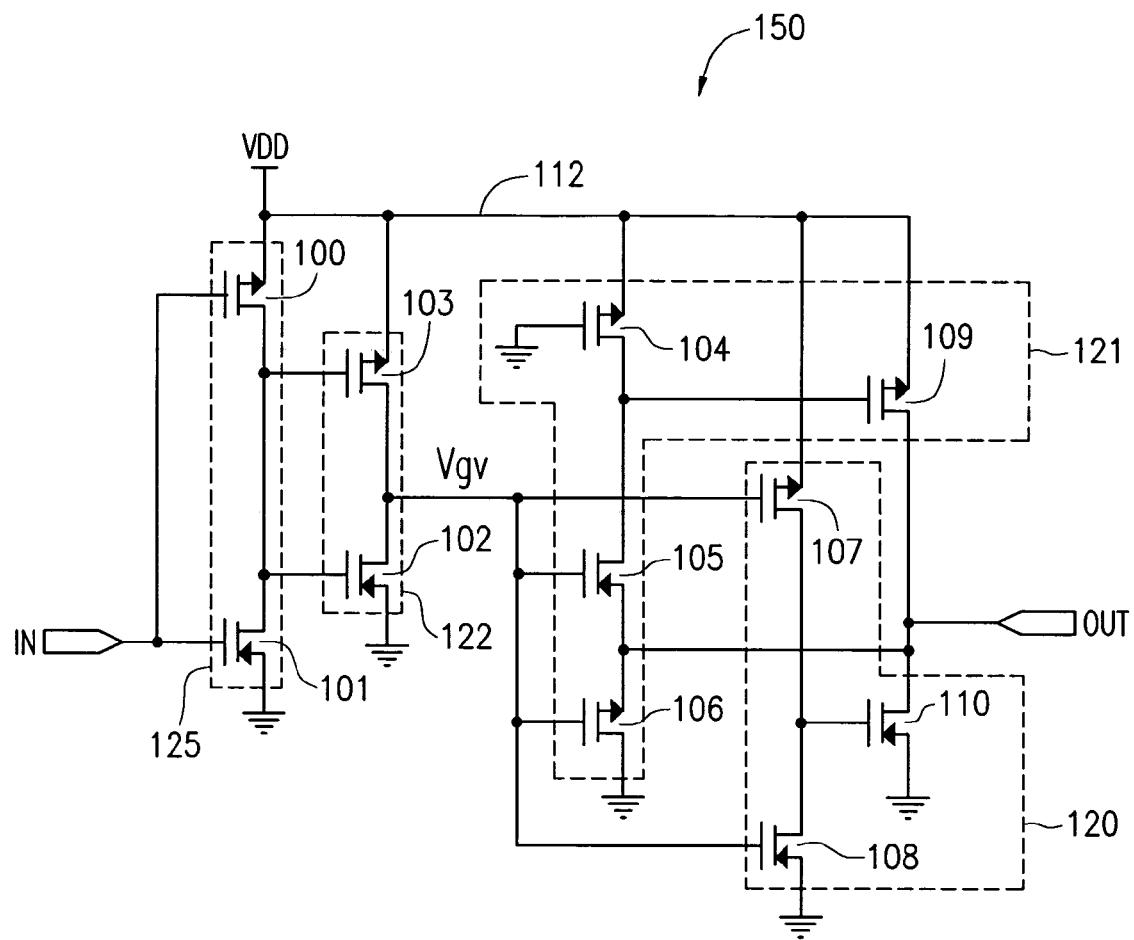
FIG. 1 is a schematic diagram of a reduced-swing line driver under a first embodiment of the invention.

FIG. 1 is a schematic diagram of a reduced-swing line driver 150 in accordance with a first embodiment of the invention, wherein the line driver effectively reduces power dissipation, for example, in high capacitance lines. Line driver 150 has an input (IN) coupled to the base of n-type CMOS transistor 101 and p-type CMOS transistor 100. Together, transistors 100 and 101 form an inverter buffer 125. The source terminal of transistor 100 is coupled to the input supply line $V_{DD}$ 112, which is also coupled with the source terminals of p-type CMOS transistors 103, 104, 107 and 109, as shown in FIG. 1. The drain terminal of transistor 100 is coupled to the drain terminal of transistor 101. The source terminal of transistor 101 is further coupled to ground.

The output inverter buffer 125 is coupled to driver circuit 122, which is comprised of p-type transistor 103 and n-type CMOS transistor 102. The output of buffer 125 is coupled to the gate terminals of transistors 102 and 103 as shown in FIG. 1. Transistors 100–101 and 102–103 are arranged as serially connected inverters. The drain terminals of transistors 102 and 103 in driver 122 are coupled together to generate an output $V_{gv}$, which is then transmitted to the unity gain voltage amplifier portion 121 and common source amplifier portion 120 of the circuit, which together form the output section of the driver circuit. Typically, the driver 122 output voltage $V_{gv}$, is between ground and the supply voltage $V_{DD}$.

The unity gain voltage amplifier portion 121 is comprised of p-type transistor 104, n-type transistor 105, p-type transistor 106 and p-type transistor 109. Voltage signal $V_{gv}$ is coupled to the gates of transistors 105, 106 and 107. The source terminals of transistors 105 and 106 are coupled together and are further connected to the output terminal OUT as shown in FIG. 1. The drain terminal of transistor 106 is coupled to ground, while the drain terminal of transistor 105 is coupled with the drain terminal of transistor 104 and further connected to the gate of transistor 109. The gate of transistor 104 is coupled to ground.

Transistors 104, 105 and 109 function as a modified complementary source-follower circuit within amplifier 121. When the voltage $V_{gv}$, is applied to the gate terminal of transistor 106, the transistor will begin to conduct when the voltage exceeds the threshold voltage for transistor 105 (i.e., when $V_{gv}-V_{out}>V_{th}$). Once it is turned on, transistor 105 will conduct current through transistor 104, which is configured to operate as a large resistor via the grounding of the gate terminal. Using Ohm's Law, once the current flows across transistor 104, a voltage will be generated from the intrinsic resistance of the transistor that will turn on transistor 109. Once transistor 109 is turned on, the voltage across transistor 105 gets pulled towards $V_{DD}$, thus supplying more current to the output load (OUT), and consequently reducing the output impedance of amplifier 121.

When the voltage across transistor 105 is less than the threshold voltage ($V_{gv}-V_{out}<V_{th}$), transistor 105 turns off, which in turn causes transistors 104 and 109 to turn off as well. Thus, it can be seen that the amplifier can efficiently pull the output signal up, but only to the level of $V_{out}=V_{gv}-V_{th}$. Since $V_{gv}$ is typically between 0V and $V_{DD}$, when $V_{gv}=V_{DD}$, then $V_{out}=V_{DD}-V_{th}$.

Transistor 106 is a p-channel source-follower transistor that sinks current when $V_{out}-V_{gv}>V_{th}$ across transistor 106. Therefore, when $V_{gv}=0V$, transistor 106 sinks current and assists the n-type transistor 110 as long as $V_{out}>V_{th}$. Once $V_{out}$ is lower than Vth, transistor 106 turns off. The gate terminal of transistor 110 is also connected to the drain terminals of p-type transistor 107 and n-type CMOS transistor 108. The gate terminals of transistors 107 and 108 also receive signal $V_{gv}$. Transistors 107, 108 and 110 together form a common source amplifier 120. Transistor 110 will turn on as long as $V_{gv}=0$. Under this configuration, transistor 110 can pull the output voltage down to ground potential $V_{ss}$ (0V), and transistor 106 assists transistor 110 for only an initial portion of the transition (i.e., as long as $V_{out}>V_{th}$).

Under the embodiment described above, when $V_{in}$ applied to input IN undergoes a negative transition, the output voltage $V_{out}$ at output OUT is pulled down to the ground potential of $V_{ss}$ (0V) via transistor 110, with the initial assistance of transistor 106. On the positive transitions of the signal $V_{in}$, the output voltage is driven by amplifier 121 through transistors 105, 104 and 109 where $V_{out}=V_{DD}-V_{th}$. As a result, the voltage swing present in the circuit 150 will be restricted to a range between 0V and $V_{DD}-V_{th}$.

Figure 2:
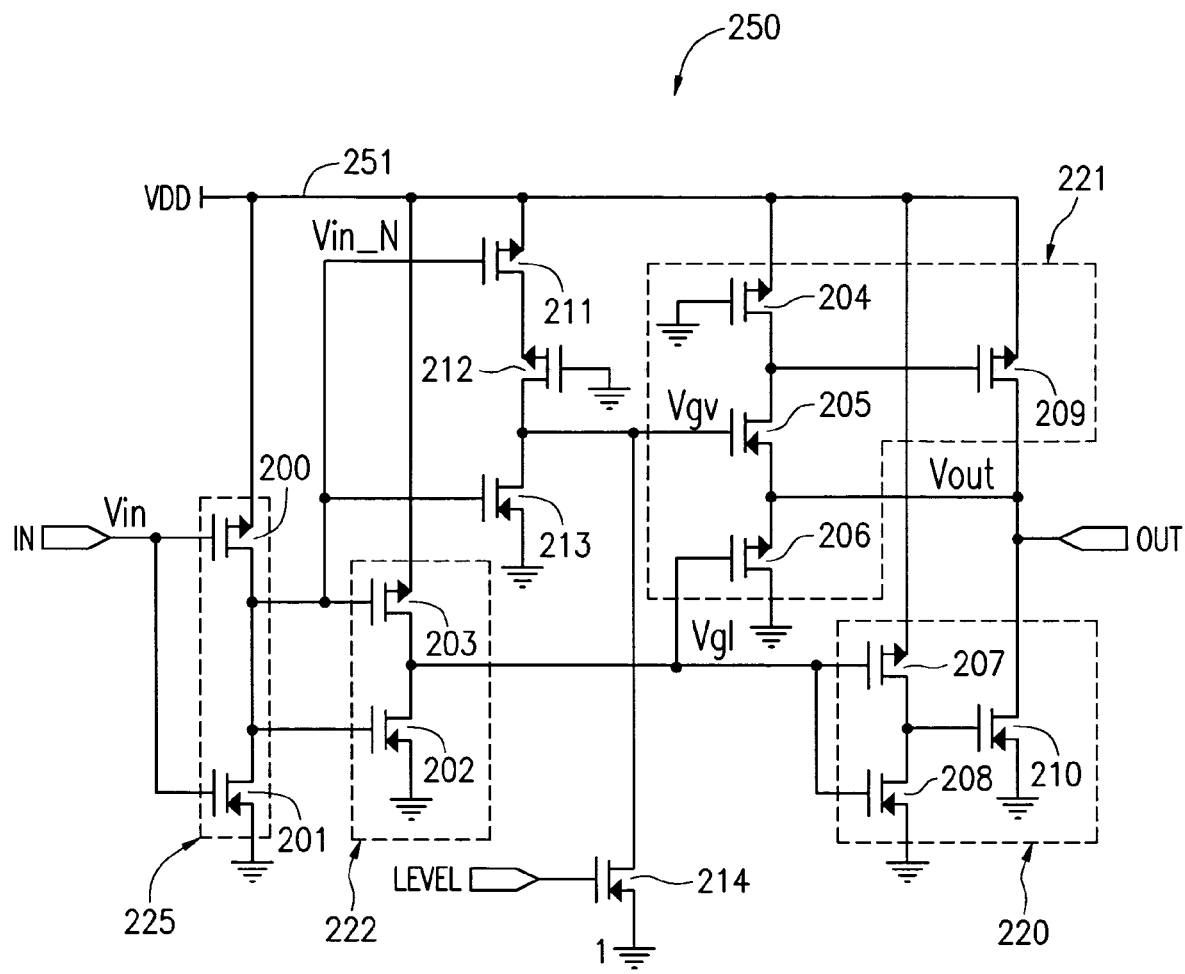
FIG. 2 is a schematic diagram of a variable reduced-swing line driver under a second embodiment of the invention.

FIG. 2 illustrates an alternate embodiment of the present invention, wherein the voltage swing limit in the circuit is made variable. The variable level line driver 250 has an input IN coupled to the gate of n-type transistor 201 and p-type transistor 200. The source terminal of transistor 200 is coupled to the $V_{DD}$ line 251, which is also coupled with the source terminals of p-type transistors 203, 211, 204, 207 and 209 as shown in FIG. 2. The drain terminal of transistor 200 is coupled to the drain terminal of transistor 201. The source terminal of transistor 201 is further coupled to ground.

The output of transistors 200 and 201, which together form an inverter 225, is coupled to driver/inverter circuit 222, which is comprised of transistor 203 and n-type transistor 202. The output of the inverter formed by transistors 200 and 201 is coupled to the gate terminals of transistors 202 and 203 as shown in FIG. 2. Transistors 200–201 and 202–203 are arranged as serially connected inverters. The drain terminals of transistors 202 and 203 in driver 222 are coupled together to generate an output $V_{gi}$, which is then transmitted to the unity gain voltage amplifier portion 221 and common source amplifier portion 220 of the circuit 250, which together form an output section of the line driver circuit 250.

Circuit 250 further comprises an attenuator portion, which contains p-type transistors 211, 212 and n-type transistors 213 and 214, as shown in FIG. 2. Transistors 211 and 213 act as switching devices, controlled by signal $V_{in\_N}$, which is received at the gate terminal of each transistor. Transistor 212 is connected between the drain terminals of transistors 211 and 213, wherein the transistor 212 acts as a resistive load via its connection to ground through the gate terminal. Transistor 214 is also connected between the drain terminals of transistors 211 and 213 as shown in FIG. 2, and functions as a variable resistor, controlled by the LEVEL input coupled to the gate terminal. The source terminals of transistors 214 and 213 are coupled to ground.

When $V_{in}$ at input IN is logic "high"($V_{DD}$), $V_{in\_N}$ will be logic "low"(0V), causing transistor 211 to turn on. Once transistor 211 turns on, current will begin to flow along the path of transistors 211, 212 and 214, resulting in a voltage $V_{gv}=V_{DD}* [R_{214}/(R_{211}+R_{212}+R_{214})]$, wherein $R_{211}$, is the effective resistance of transistor 211, $R_{212}$ is the effective resistance of transistor 212, and $R_{214}$ is the effective resistance of transistor 214. Since the resistance of transistor 214 is variable, the resulting voltage at $V_{gv}$, will be variable as well, and the magnitude of the output signal $V_{out}$ at output OUT can be variably controlled. The $V_{gv}$ signal is then connected to the gate terminal of transistor 205 in the unity gain voltage amplifier portion 221 of circuit 250.

The unity gain voltage amplifier portion 221 is comprised of p-type transistor 204, n-type transistor 205, p-type transistor 206 and p-type transistor 209. Voltage signal $V_{gv}$ is coupled to the gate terminal of transistors 205, while voltage signal $V_{gi}$ is coupled to the gate terminal of transistor 206. The source terminals of transistors 205 and 206 are coupled together and are further connected to the output terminal OUT as shown in FIG. 2. The drain terminal of transistor 206 is coupled to ground, while the drain terminal of transistor 205 is coupled with the drain terminal of transistor 204 and further connected to the gate of transistor 209. The gate terminal of transistor 204 is coupled to ground.

Transistors 204, 205 and 209 function as a modified source-follower circuit within circuit 221. When the voltage $V_{gv}$, is applied to the gate terminal of transistor 205, the transistor will begin to conduct when the voltage exceeds the threshold voltage for transistor 205 (i.e., when $V_{gv}-V_{out}>V_{th}$). Once it is turned on, transistor 205 will conduct current through transistor 204, which is configured to operate as a large transistor via the grounding of the gate terminal. Once the current flows across transistor 204, a voltage will be generated that will turn on transistor 209. Once transistor 209 is turned on, the voltage across transistor 205 gets pulled towards $V_{DD}$, thus supplying more current to the output load (OUT), and consequently reducing the output impedance of follower 221.

When the voltage across transistor 205 is less than the threshold voltage ($V_{gv}-V_{out}<V_{th}$), transistor 205 turns off, which in turn causes transistors 204 and 209 to turn off as well. Thus, it can be seen that the amplifier can efficiently pull the output signal up, but only to the level of $V_{out}=V_{gv}-V_{th}$.

Transistor 206 is a p-channel source-follower transistor that sinks current when $V_{out}-V_{gl}>V_{th}$ across transistor 206. Therefore, when $V_{gl}=0V$, transistor 206 sinks current and causes n-type transistor 210 to turn on. Thus transistor 210 is driven by a signal that is the inverse of signal $V_{gl}$ and will remain on as long as $V_{gl}$, is low. The gate terminal of transistor 210 is also connected to the drain terminals of p-type transistor 207 and n-type transistor 208. The gate terminals of transistors 207 and 208 also receive signal $V_{gl}$. Transistors 207, 208 and 210 together form a common source amplifier 220. Transistor 210 will turn on as long as $V_{gl}=0$, while transistor 206 will conduct only as long as the output voltage ($V_{out}$) is greater that $V_{th}$. Under this configuration, transistor 210 can pull the output voltage down to $V_{ss}$, and transistor 206 assists transistor 210 for only an initial portion of the transition (i.e., as long as $V_{out}>V_{th}$).

On negative transitions of the input signal $V_{in}$, the output voltage $V_{out}$ is pulled down to the potential of $V_{ss}$ (0V) by transistor 210, with the initial assistance of transistor 206. During positive transition of the input signal $V_{in}$, the output signal becomes driven by transistors 205, 204 and 209 of the unity gain voltage amplifier portion 221, and the output voltage governed by $V_{out}=V_{gv}-V_{th}$.

Figure 3:
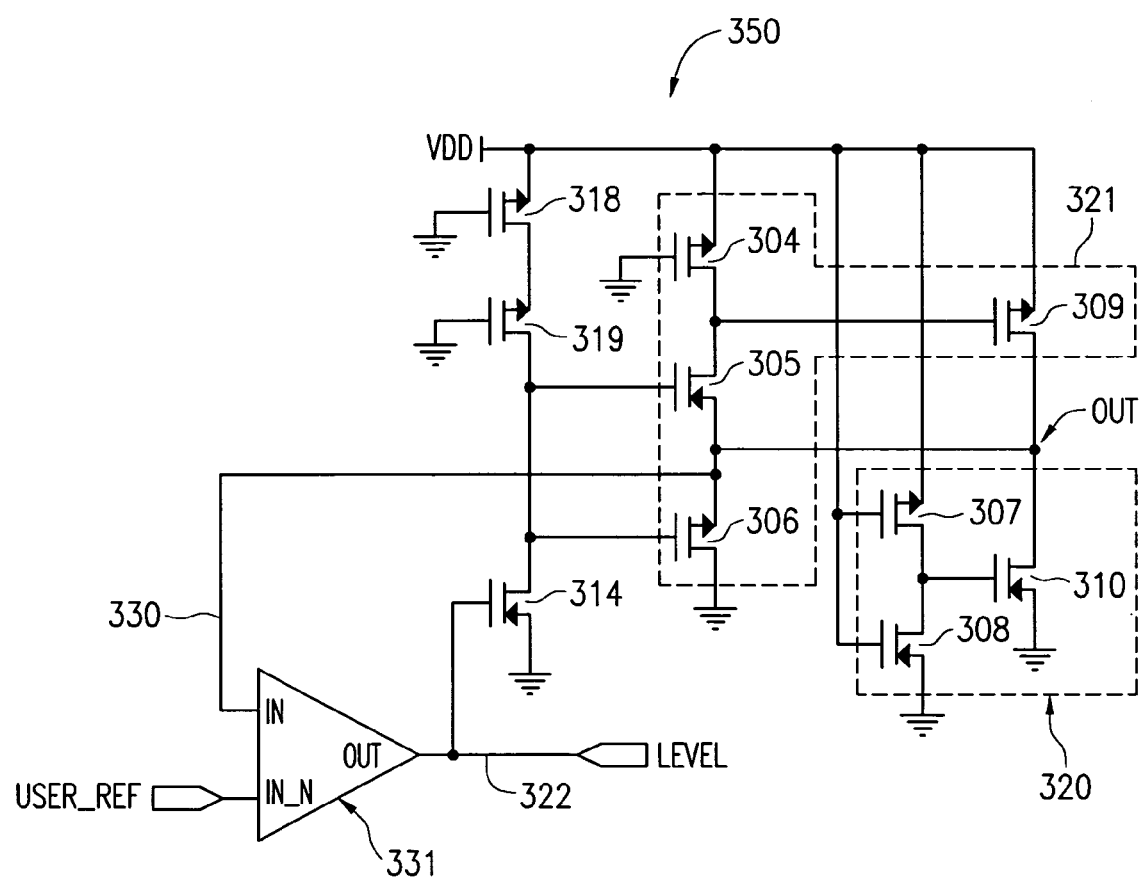
FIG. 3 is a schematic diagram of a level control circuit under the second embodiment of the invention.

FIG. 3 illustrates an embodiment of a level control circuit 350, wherein transistors 304–310 and 314 are substantially equivalent to transistors 204–210 and 214 discussed in FIG. 2. Thus, amplifiers 321 and 320 also operate in a substantially identical way to amplifiers 221 and 220 discussed in FIG. 2. In addition, FIG. 3 discloses a feedback loop 321, which connects from the node between the source terminals of transistors 305 and 306 (which is also connected to the output node OUT), to the non-inverting input (IN) of operational amplifier 329. Operational amplifier 320 also has a second input line (IN_N) that has a user reference signal (USER_REF) transmitted across it. Signal USER_REF is typically a voltage inputted by a user to specify the level of swing that will be tolerated within the circuit.

As discussed previously, transistor 314 (which is an equivalent of transistor 214 in FIG. 2), behaves as a variable resistor, wherein the output line (LEVEL) 322 of amplifier 320 is connected to the gate terminal of transistor 314. P-type transistors 318 and 319 are also set to function as resistors by grounding the base terminals of each transistor. To set the voltage of the LEVEL signal (see FIG. 2), the positive magnitude of $V_{out}$ is controlled to a desired level. A voltage equal to the desired output magnitude is applied on the USER_REF input, and the control loop sets the LEVEL signal which is used to control a variable level line driver 250.

Figure 4:
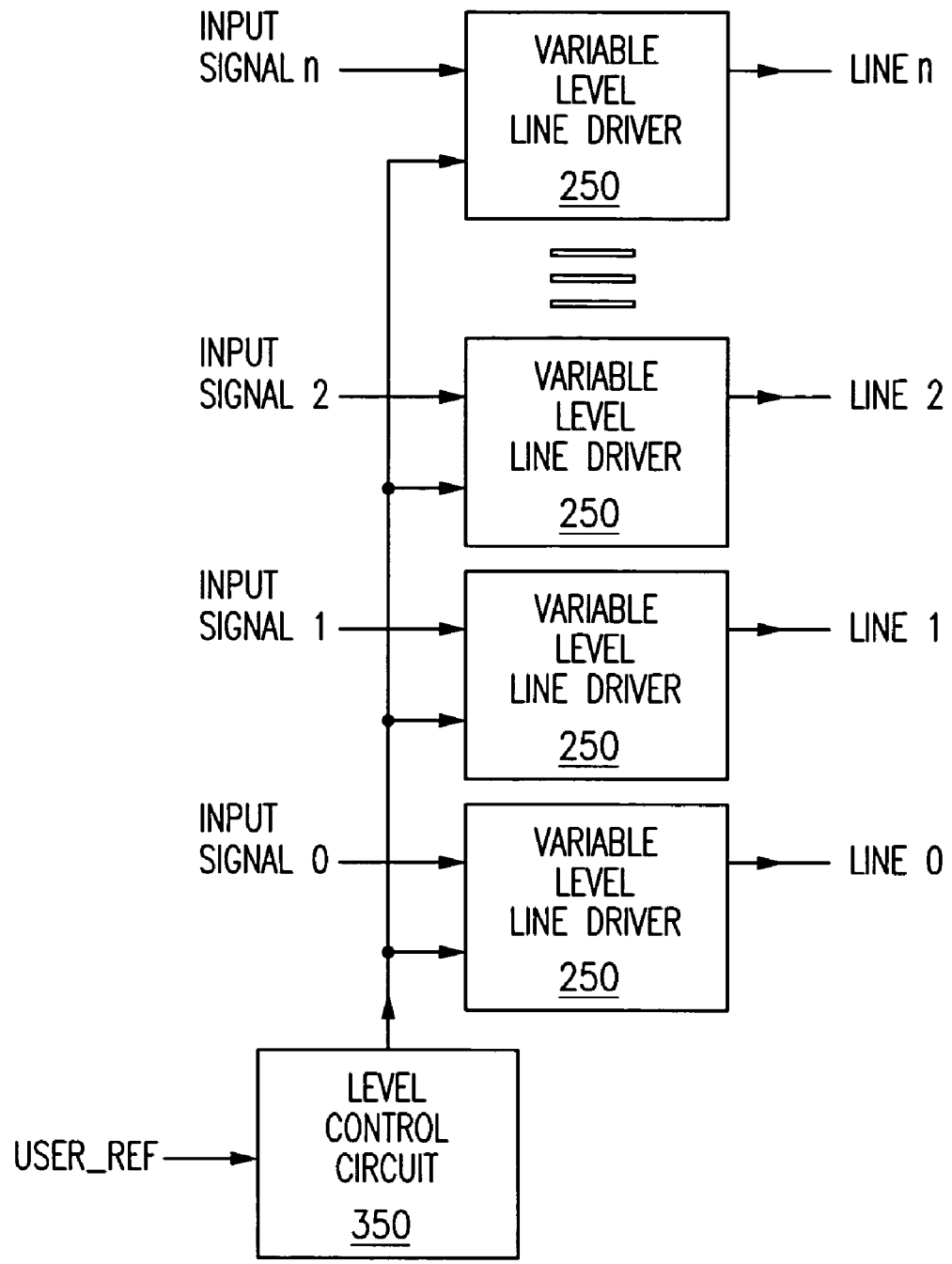
FIG. 4 illustrates a level control circuit configured for multiple line drivers.

FIG. 4 illustrates an embodiment wherein the level control circuit 350 is used to control a plurality of variable level line drivers 250. The level control circuit 350 of FIG. 4 is equivalent to the circuit 350 disclosed in FIG. 3, while each variable level line driver 250 is equivalent to the driver 250 of FIG. 2. As is seen in FIG. 4, a user reference input USER_REF, specifying the voltage magnitude, is transmitted to the level control circuit 350, which generates a LEVEL signal that is sent to each variable level line driver 250. Accordingly, each variable level line driver 250 will receive the LEVEL signal at an input, illustrated as the base terminal of transistor 214 in FIG. 2. As the input of each variable level line driver (INPUT SIGNAL 0-n) is received, each of the drivers will output a signal on a respective line (LINE 0-n) that will have a limited swing as set by a user.

Figure 5:
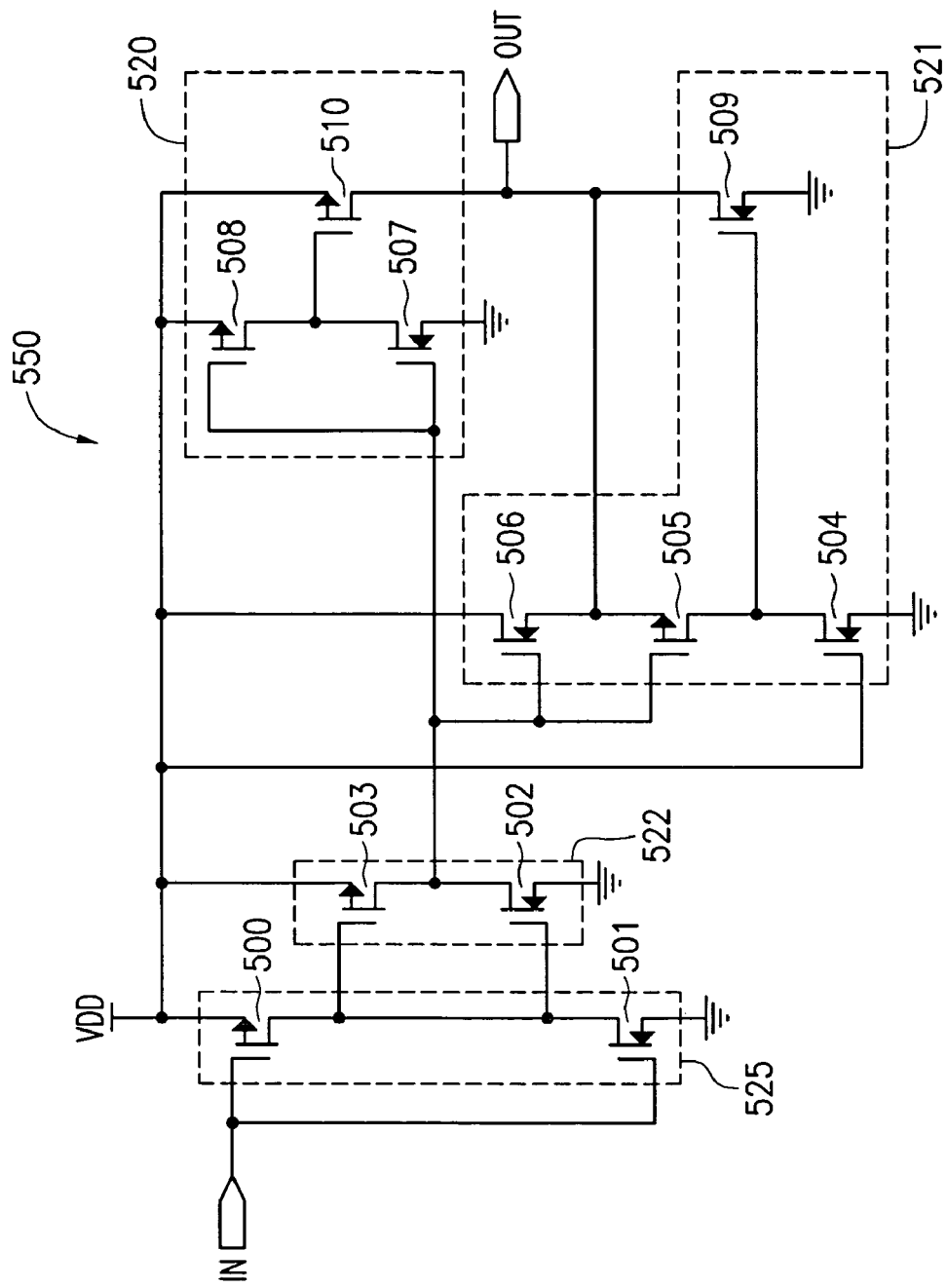
FIG. 5 is a schematic diagram of the reduced-swing line driver according to FIG. 1, wherein the transistor types are reversed.
Figure 6:
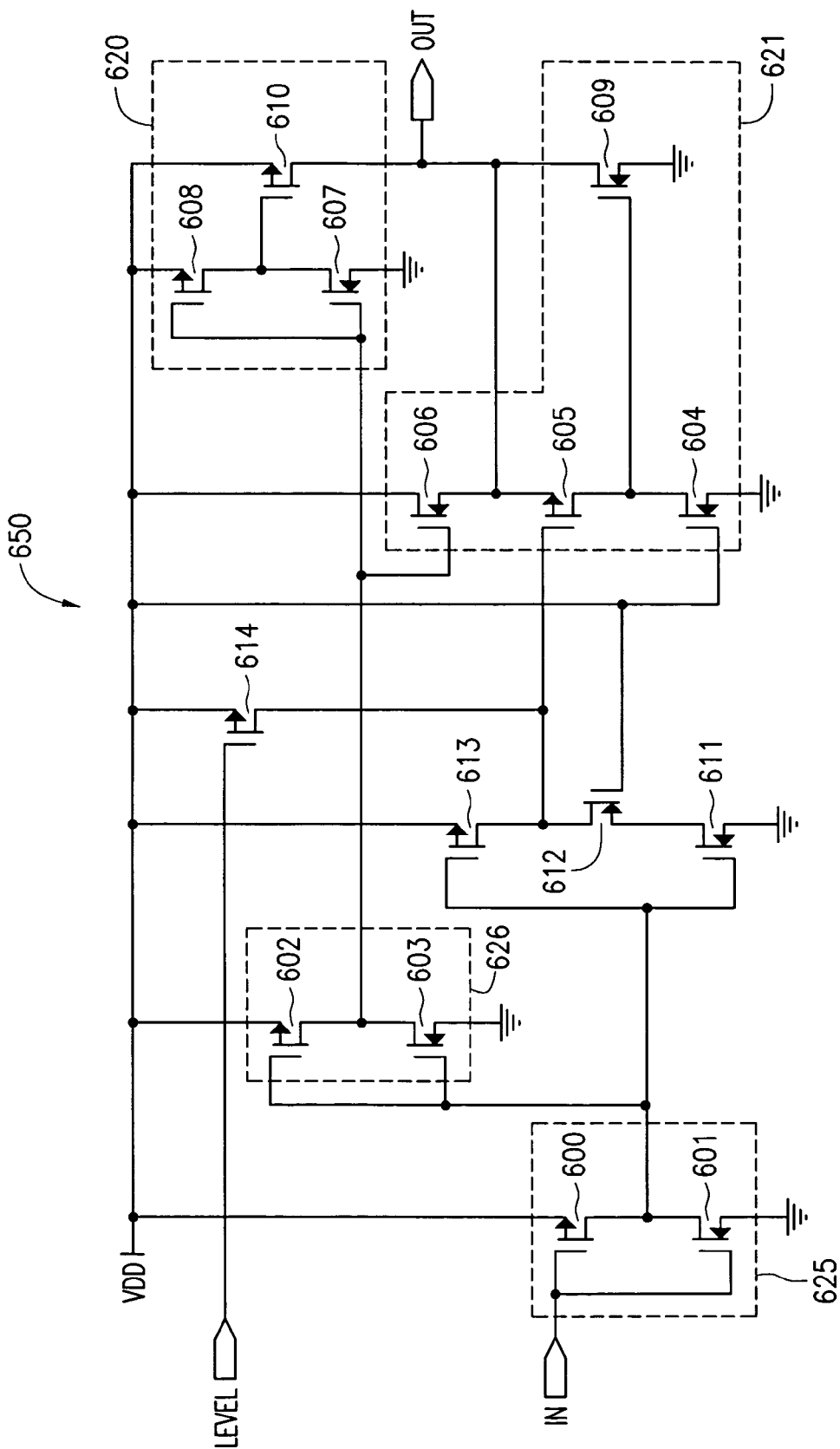
FIG. 6 is a schematic diagram of a variable reduced-swing line driver according to FIG. 2, wherein the transistor types are reversed.
Figure 7:
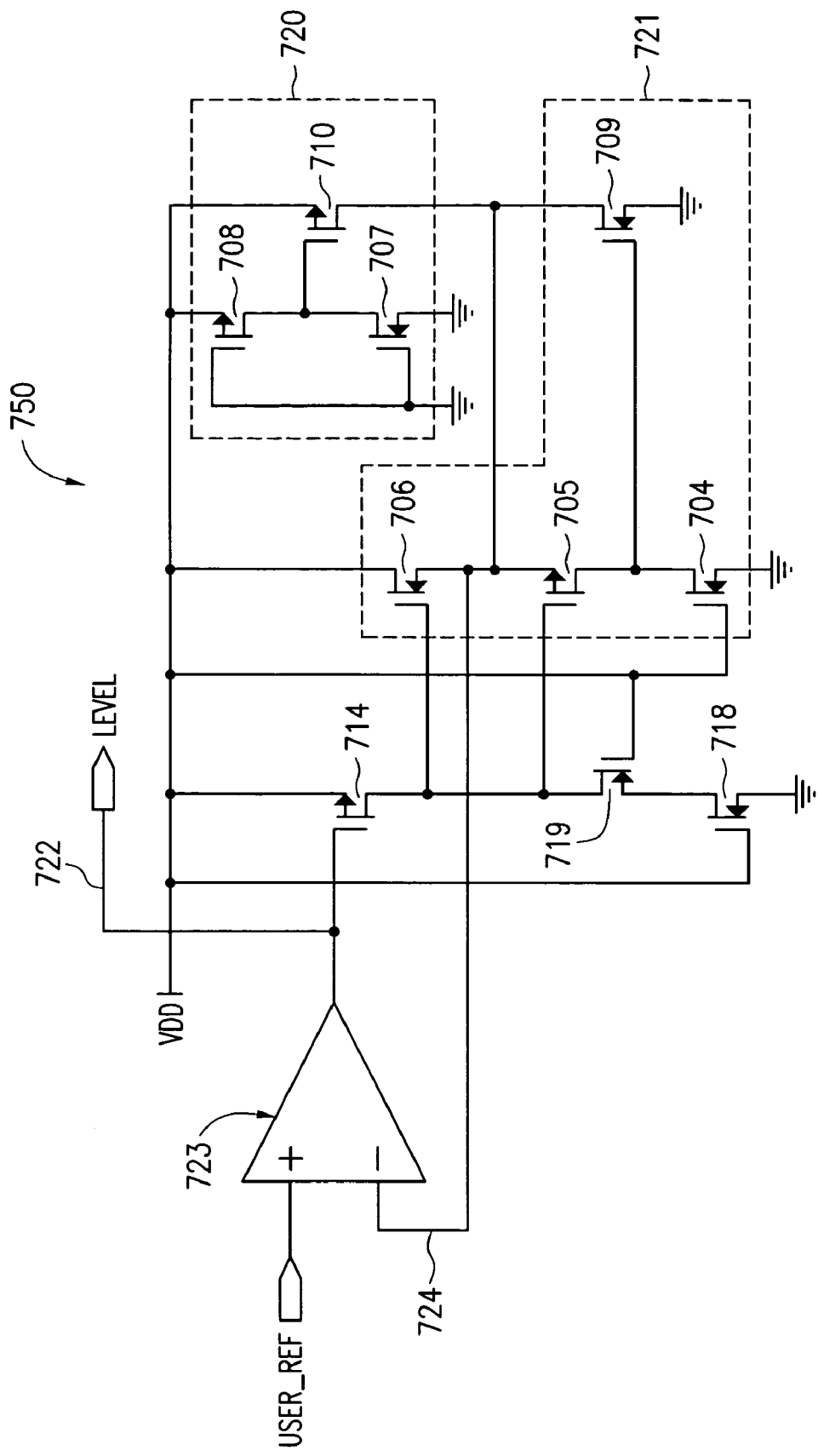
FIG. 7 is a schematic diagram of a level control circuit according to FIG. 3, wherein the transistor types are reversed.

FIGS. 5–7 are equivalent circuits to those described in FIGS. 1–3 respectively, except that all p-type transistors are replaced with n-type transistors, and vice versa. The operation of each type of transistor is well-known in the art and will not be discussed further. Each of the FIG. 5–7 circuits operate to limit the swing of the output voltage in the manner discussed above for FIGS. 1–3.

While the invention has been described in detail in connection with preferred embodiments known at the time, it should be readily understood that the invention is not limited to the disclosed embodiments. Rather, the invention can be modified to incorporate any number of variations, alterations, substitutions or equivalent arrangements not heretofore described, but which are commensurate with the spirit and scope of the invention. It is also understood that the p-type and n-type transistors described in the embodiments above can be reversed, wherein n-type transistors may be used in place of p-type, and vice versa. Accordingly, the invention is only limited by the scope of the following claims.

What is claimed as new and desired to be protected by Letters Patent of the United States is:

1. A variable level swing circuit, comprising:
 a variable voltage level line;
 a first transistor, having a gate terminal coupled to the variable voltage level line, a source terminal coupled to ground, and a drain terminal coupled to a first voltage node;
 a second transistor, having a gate terminal coupled to an input voltage, a source terminal coupled to ground, and a drain terminal coupled to the first voltage node;
 a third transistor, having a gate terminal coupled to ground and a drain terminal coupled to a drain terminal on the second transistor; and
 a fourth transistor, having a gate terminal coupled to the input voltage, a source terminal coupled to a supply voltage, and a drain terminal coupled to a source terminal on the third transistor.

2. The variable level line driver according to claim 1, wherein the first and second transistors are n-type transistors, and the third and fourth transistors are p-type transistors.

3. The variable level line driver according to claim 1, wherein the first voltage node is coupled to an input of a first amplifier having a threshold voltage, said first amplifier being connected to a second voltage node and to an output terminal.

4. The variable level line driver according to claim 3, wherein the first amplifier is a unity gain amplifier.

5. The variable level line driver according to claim 3, further comprising:
a second amplifier is connected to the second voltage node and the output terminal, said first and second amplifiers operating such that the voltage swing on the output terminal is variable between ground and a value no greater than the supply voltage minus the threshold voltage.

6. The variable level line driver according to claim 5, wherein the second amplifier is a common-source amplifier.

7. A variable level line driver, comprising:
a variable voltage level line;
a first transistor, having a gate terminal coupled to the variable voltage level line, a source terminal coupled to a supply voltage, and a drain terminal coupled to a voltage node;
a second transistor, having a gate terminal coupled to an input voltage, a source terminal coupled to the supply voltage, and a drain terminal coupled to the voltage node;
a third transistor, having a gate terminal coupled to the supply voltage and a drain terminal coupled to a drain terminal on the second transistor; and
a fourth transistor, having a gate terminal coupled to the input voltage, a source terminal coupled to ground, and a drain terminal coupled to a source terminal on the third transistor.

8. The variable level line driver according to claim 7, wherein the first and second transistors are n-type transistors, and the third and fourth transistors are p-type transistors.

9. The variable level line driver according to claim 7, wherein the first voltage node is coupled to an input of a first amplifier having a threshold voltage, said first amplifier being connected to a second voltage node and to an output terminal.

10. The variable level line driver according to claim 9, wherein the first amplifier is a unity gain amplifier.

11. The variable level line driver according to claim 9, further comprising:
a second amplifier is connected to the second voltage node and the output terminal, said first and second amplifiers operating such that the voltage swing on the output terminal is variable between ground and a value no greater than the supply voltage minus the threshold voltage.

12. The variable level line driver according to claim 11, wherein the second amplifier is a common-source amplifier.

13. A method for setting a variable level for a line driver, comprising:
generating a first voltage by activating a first transistor connected to a supply voltage, said first transistor having a first resistive value;
generating a second voltage across a second transistor when the first transistor is activated, said second transistor having a second resistive value; and
generating a third variable voltage across a third transistor, connected to a variable-level voltage line, said third transistor having a third resistive value, wherein the first, second and third voltages are transmitted to a voltage node.

14. The method according to claim 13, wherein the first and second transistors are p-type, and the third transistor in n-type.

15. The method according to claim 13, wherein the first and second transistors are n-type, and the third transistor in p-type.

16. The method according to claim 13, wherein the voltage at the voltage node is:

$$V = V_{DD} * [R_3/R_1 + R_2 + R_3]$$

where V is the node voltage, $V_{DD}$ is the supply voltage, $R_1$ is the resistive value of the first transistor, $R_2$ is the resistive value of the second transistor, and $R_3$ is the resistive value of the third transistor.

17. A level control circuit, comprising:
an operational amplifier, having a first input, a second input, and an output line, said second input receiving a reference voltage;
a first transistor, having a gate terminal coupled to the output line, and a source terminal coupled to ground;
a resistive element, coupled to a supply voltage, and to a drain terminal of the first transistor;
a first amplifier, coupled to the supply voltage, an output node, and to the drain terminal of the first transistor;
a second amplifier, coupled to the first amplifier, the supply voltage, and output node; and
a feedback loop, coupled from the output node to the first input of the operational amplifier.

18. The level control circuit of claim 17, wherein the resistive element comprises a second and third transistor, said second transistor having a gate terminal coupled to ground, a drain terminal coupled to the drain terminal of the first transistor, said third transistor having a gate terminal coupled to ground, a drain terminal coupled to the source terminal of the second transistor, and a source terminal coupled to the supply voltage.

19. The level control circuit of claim 18, wherein the first transistor is a n-type transistor, and the second and third transistors are p-type transistors.

20. The level control circuit of claim 17, wherein the first amplifier is a unity gain voltage amplifier.

21. The level control circuit of claim 20, wherein the unity gain voltage amplifier comprises a source-follower circuit.

22. The level control circuit of claim 17, wherein the first amplifier comprises:
a fourth transistor, having a gate terminal coupled to the drain terminal of the first transistor, and a source terminal coupled to the output node;
a fifth transistor, having a gate terminal coupled to the drain terminal of the first transistor, and a source terminal coupled to the source terminal of the fourth transistor;
a sixth transistor, having a gate terminal coupled to ground, a drain terminal coupled to the drain terminal of the fifth transistor, and a source terminal coupled to the supply voltage; and
a seventh transistor, having a gate terminal coupled to the drain terminal of the fifth transistor, a source terminal coupled to the supply voltage, and a drain terminal coupled to the output node.

23. The level control circuit of claim 22, wherein the first and fifth transistors are n-type transistors, and the fourth, sixth and seventh transistors are p-type.

24. The level control circuit of claim 22, wherein the feedback loop is couples from the output node to the source terminal of the fourth transistor, and further to the first input on the operational amplifier.

25. The level control circuit of claim 17, wherein the second amplifier is a common source amplifier.

26. The level control circuit of claim 17, wherein the second amplifier comprises:

an eighth transistor, having a gate terminal coupled to the supply voltage, and a source terminal coupled to ground;
a ninth transistor, having a gate terminal and a source terminal coupled to the supply voltage, and a drain terminal coupled to the drain terminal of the eighth transistor; and
a tenth transistor, having a gate terminal coupled to the drain terminal of the eighth transistor, a source terminal coupled to ground, and a drain terminal coupled to the output node.

27. The level control circuit of claim 26, wherein the first, eighth and tenth resistors are n-type transistors, and the ninth transistor is a p-type transistor.

28. The level control circuit of claim 17, wherein the output line of the operational amplifier is coupled to at least one variable level line driver.

29. A level control circuit, comprising:
an operational amplifier, having a first input, a second input, and an output line, said second input receiving a reference voltage;
a first transistor, having a gate terminal coupled to the output line, and a source terminal coupled to a supply voltage;
a resistive element, coupled to ground, and to a drain terminal of the first transistor;
a first amplifier, coupled to the supply voltage, an output node, and to the drain terminal of the first transistor;
a second amplifier, coupled to the first amplifier, the supply voltage, and output node; and
a feedback loop, coupled from the output node to the first input of the operational amplifier.

30. The level control circuit of claim 29, wherein the resistive element comprises a second and third transistor, said second transistor having a gate terminal coupled to the supply voltage, a drain terminal coupled to the drain terminal of the first transistor, said third transistor having a gate terminal coupled to the supply voltage, a drain terminal coupled to the source terminal of the second transistor, and a source terminal coupled to ground.

31. The level control circuit of claim 30, wherein the first transistor is a p-type transistor, and the second and third transistors are n-type transistors.

32. The level control circuit of claim 30, wherein the first amplifier is a unity gain voltage amplifier.

33. The level control circuit of claim 32, wherein the unity gain voltage amplifier comprises a source-follower circuit.

34. The level control circuit of claim 29, wherein the first amplifier comprises:
a fourth transistor, having a gate terminal coupled to the drain terminal of the first transistor, a drain terminal coupled to the supply voltage, and a source terminal coupled to the output node;
a fifth transistor, having a gate terminal coupled to the drain terminal of the first transistor, and a source terminal coupled to the source terminal of the fourth transistor;
a sixth transistor, having a gate terminal coupled to the supply voltage, a drain terminal coupled to the drain terminal of the fifth transistor, and a source terminal coupled to ground; and
a seventh transistor, having a gate terminal coupled to the drain terminal of the fifth transistor, a source terminal coupled to the supply voltage, and a drain terminal coupled to the output node.

35. The level control circuit of claim 34, wherein the first and fifth transistors are p-type transistors, and the fourth, sixth and seventh transistors are n-type.

36. The level control circuit of claim 29, wherein the feedback loop is coupled from the output node to the source terminal of the fourth transistor, and further to the first input on the operational amplifier.

37. The level control circuit of claim 29, wherein the second amplifier is a common source amplifier.

38. The level control circuit of claim 29, wherein the second amplifier comprises:
an eighth transistor, having a gate terminal coupled to ground, and a source terminal coupled to the supply voltage;
a ninth transistor, having a gate terminal and a source terminal coupled to ground, and a drain terminal coupled to the drain terminal of the eighth transistor; and
a tenth transistor, having a gate terminal coupled to the drain terminal of the eighth transistor, a source terminal coupled to the supply voltage, and a drain terminal coupled to the output node.

39. The level control circuit of claim 38, wherein the first, eighth and tenth resistors are p-type transistors, and the ninth transistor is a n-type transistor.

40. The level control circuit of claim 29, wherein the output line of the operational amplifier is coupled to at least one variable level line driver.

41. A method of setting a voltage swing level reference, comprising:
setting a reference voltage on one input of an operational amplifier;
transmitting current from an output of the operational amplifier to a resistive circuit;
activating an amplifier circuit to generate a voltage at a node when said current at the resistive current generates a first voltage;
providing a feed-back of the voltage at the node to a second input of said amplifier; and
adjusting the voltage transmitted to the output of the operational amplifier, so that the feed-back voltage and the reference voltage are substantially the same.

42. The method of claim 41, wherein the amplifier circuit is activated when the first voltage reaches a threshold voltage for the amplifier circuit.

43. The method of claim 41, wherein the output voltage of the operational amplifier is transmitted to at least one variable level line driver.

44. A variable level circuit, comprising:
a variable voltage level line;
a first transistor, having a gate terminal coupled to the variable voltage level line and a source/drain terminal coupled to a first voltage node;
a second transistor, having a gate terminal coupled to an input voltage and a source/drain terminal coupled to the first voltage node;
a third transistor, having a gate terminal coupled to ground and a drain terminal coupled to a drain terminal on the second transistor; and
a fourth transistor, having a gate terminal coupled to the input voltage and a drain terminal coupled to a source terminal on the third transistor.

45. A method for setting a variable level for a line driver, comprising:
generating a first voltage by activating a first transistor, said first transistor having a first resistive value;

generating a second voltage across a second transistor when the first transistor is activated, said second transistor having a second resistive value; and generating a third variable voltage across a third transistor, connected to a variable-level voltage line, said third transistor having a third resistive value, wherein the first, second and third voltages are transmitted to a voltage node.

* * * * *

UNITED STATES PATENT AND TRADEMARK OFFICE
CERTIFICATE OF CORRECTION

PATENT NO. : 7,084,669 B2 Page 1 of 1
APPLICATION NO. : 10/949376
DATED : August 1, 2006
INVENTOR(S) : Zvi Regev It is certified that error appears in the above-identified patent and that said Letters Patent is hereby corrected as shown below:

Column 3, line 44, "($V_{gv}$," should read --($V_{gv}$--; and

Column 4, line 33, "$V_{in\_N}$" should read --$V_{in\_N}$--.

In the Claims, the following errors are corrected:

Claim 14, column 7, line 63, "in" should read --is--;

Claim 18. column 7, line 66, "in" should read --is--; and

Claim 24, column 8, line 61, "couples" should read --coupled--.

Signed and Sealed this

Twelfth Day of December, 2006

JON W. DUDAS
*Director of the United States Patent and Trademark Office*